(12) United States Patent
Murayama et al.

(10) Patent No.: US 7,897,510 B2
(45) Date of Patent: Mar. 1, 2011

(54) SEMICONDUCTOR DEVICE PACKAGE, SEMICONDUCTOR APPARATUS, AND METHODS FOR MANUFACTURING THE SAME

(75) Inventors: Kei Murayama, Nagano (JP); Akinori Shiraishi, Nagano (JP); Masahiro Sunohara, Nagano (JP); Yuichi Taguchi, Nagano (JP); Naoyuki Koizumi, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 363 days.

(21) Appl. No.: 11/896,009

(22) Filed: Aug. 29, 2007

(65) Prior Publication Data

US 2008/0054486 A1    Mar. 6, 2008

(30) Foreign Application Priority Data

Sep. 6, 2006  (JP) .............................. P.2006-242021

(51) Int. Cl.
*H01L 21/00* (2006.01)

(52) U.S. Cl. .................. 438/667; 257/E21.597; 257/621

(58) Field of Classification Search .................. 438/667; 257/621, E21.597
See application file for complete search history.

(56) References Cited

U.S. PATENT DOCUMENTS

| 6,400,172 | B1 | 6/2002 | Akram et al. | |
|---|---|---|---|---|
| 6,787,916 | B2* | 9/2004 | Halahan | 257/777 |
| 7,098,070 | B2* | 8/2006 | Chen et al. | 438/106 |
| 2002/0151171 | A1* | 10/2002 | Furusawa | 438/660 |
| 2003/0119308 | A1* | 6/2003 | Geefay et al. | 438/640 |
| 2005/0266687 | A1* | 12/2005 | Morimoto | 438/667 |
| 2006/0040494 | A1* | 2/2006 | Hiatt | 438/667 |

FOREIGN PATENT DOCUMENTS

| JP | 2005-019609 | 1/2005 |
|---|---|---|
| JP | 2005-327820 | 11/2005 |
| WO | WO 2006/004127 | 1/2006 |

* cited by examiner

*Primary Examiner* — Steven J Fulk
(74) *Attorney, Agent, or Firm* — Drinker Biddle & Reath LLP

(57) ABSTRACT

A method for manufacturing a package which includes: an etching step of etching a silicon substrate, and forming a via hole penetrating through the silicon substrate; and a step of embedding an electrically conductive material in the via hole, and forming a via plug, characterized in that the etching step includes a first etching step of forming the via hole in a straight shape, and a second etching step of forming the via hole in a taper shape.

8 Claims, 8 Drawing Sheets

SEMICONDUCTOR DEVICE PACKAGE, SEMICONDUCTOR APPARATUS, AND METHODS FOR MANUFACTURING THE SAME

This application claims foreign priority based on Japanese Patent application No. 2006-242021, filed on Sep. 6, 2006, the contents of which is incorporated herein by reference in its entirety.

BACKGROUND OF THE INVENTION

1. Field of the Invention

The present invention relates to a semiconductor apparatus including a semiconductor device mounted on a silicon substrate, and a method for manufacturing the semiconductor apparatus.

2. Description of the Related Art

As for the structure of the semiconductor apparatus including a semiconductor device mounted on a substrate, various types of them have been proposed such as disclosed in Japanese unexamined patents 2005-19609 or 2005-327820.

For example, when a silicon substrate is used for mounting a semiconductor device, micromachining on the substrate becomes possible. This enables a manufacturer to downsize a semiconductor apparatus. Further, silicon has higher thermal conductivity as compared with that of a sintered material such as ceramic. For this reason, there is an advantage of improving a heat radiation property under the situation such as mounting a device having relative large heat value, for instance, a light emitting device (LED). As the exemplified structure of a semiconductor device that is mounted on a silicon substrate, one of the known structures is a semiconductor device which is connected to a via plug penetrating through a substrate for mounting.

When the via plug is formed, first, a via hole (through hole) penetrating through a silicon substrate is formed, and then, an electrically conductive material is embedded in the via hole for its formation. The via hole is formed so as to penetrate through the silicon substrate in a cylindrical form by using, for example, a plasma (dry) etching technique.

However, when a via hole penetrating through a silicon substrate is formed, the defective shape (variation in shape) of the via hole may occur.

In general, such a defective shape is more likely to occur in the opening portion of the via hole. For example, performing the dry etching with using a mask pattern, problems of fine peeling, defective shape, or the like tend to occur at the interface between the silicon substrate and the mask pattern.

For this reason, various defective shapes of etching occur due to the problem of the mask pattern in the vicinity of the opening. In such a condition, in some cases, the cross sectional shape of the via hole is not formed in a circular shape in the vicinity of the opening. Further, a stress becomes more likely to concentrate to the opening portion of the via hole. This entails the fear that the damage (such as chipping or cracking) of the silicon substrate occurs.

Further, the occurrence of the defective shape of the via hole unfavorably deteriorates the reliability of the via plug.

SUMMARY OF THE INVENTION

Under such circumstances, a high-level object of the present invention resides at providing a novel and useful semiconductor package, a semiconductor apparatus, a method for manufacturing a package, and a method for manufacturing a semiconductor apparatus, by solving the foregoing problems.

More specifically, the present invention is directed to increase the reliability of a package formed by using a silicon substrate, and mounting of a semiconductor apparatus including a semiconductor device mounted on the package.

In accordance with a first viewpoint of the present invention, the foregoing problems are solved by a method for manufacturing a semiconductor device package which includes: an etching step of etching a silicon substrate to form a via hole which penetrates through the silicon substrate; and a step of embedding conductive material in the via hole to form a via plug, wherein said etching step includes a first etching step of forming the via hole in a straight shape, and a second etching step of forming the via hole in a taper shape.

In accordance with the invention, it becomes possible to make favorable and reliable device package.

Further, when etching is carried out such that each opening of the via hole is formed in a taper shape, the reliability of the via plug improves.

Still further, when said first etching step is carried out by anisotropic dry etching, and said second etching is carried out by isotropic dry etching, forming the via hole becomes more efficiently.

Likewise, when said first etching step is carried out by dry etching, and said second etching is carried out by wet etching, forming the via hole becomes also efficiently.

Further, when the method further includes a step of forming a concave portion in the silicon substrate, mounting of the semiconductor device becomes efficiently.

Still further, in accordance with a second viewpoint of the invention, the foregoing problems are solved by a method for manufacturing a semiconductor apparatus including the method for manufacturing its package, further including a step of mounting a semiconductor device on the concave portion.

Furthermore, in accordance with a third viewpoint of the invention, the foregoing problems are solved by a package comprising a silicon substrate, and a via plug penetrating through the silicon substrate, wherein said via plug has a straight portion formed in a straight or cylindrical shape, and a taper portion formed in a taper shape.

In accordance with the invention, it becomes possible to make a reliable semiconductor package.

Whereas, when said taper portion is formed at a vicinity of the via plug being exposed from the silicon substrate, it is more favorable for the reliability of the via plug.

Further, when the silicon substrate has a concave portion for mounting a semiconductor device provided therein, mounting of the semiconductor device becomes efficiently.

Furthermore, in accordance with a fourth viewpoint of the invention, the foregoing problems are solved by a semiconductor apparatus including the foregoing package, and a semiconductor device mounted on the concave portion.

As a whole to say, this invention can improve the reliability of mounting of a semiconductor apparatus with a semiconductor device being mounted on a silicon substrate.

DESCRIPTION OF THE PREFERRED EMBODIMENTS

Embodiments of the present invention will be described herein below by reference to the drawings. Unless otherwise specifically defined in the specification, terms have their ordinary meaning as would be understood by those of ordinary skill in the art.

A method for manufacturing a package in accordance with the present invention includes: an etching step of etching a silicon substrate, and forming a via hole penetrating through the silicon substrate; and a step of embedding an electrically conductive material in the via hole, and forming a via plug, characterized in that the etching step includes a first etching step of forming the via hole in a straight or cylindrical shape, and a second etching step of forming the via hole in a taper shape.

With the package formed by the foregoing manufacturing method, the via plug has a straight portion formed in a straight shape, and a taper portion formed in a taper shape.

With the method for manufacturing a package, it becomes possible to control variations in etching shape when the via hole is formed in the silicon substrate, and to make favorable the reliability of the via plug to be formed. For example, in the etching step, etching is carried out such that the opening sides of the via hole are formed in a taper shape. This can suppress the occurrence of variations in etching shape on the opening sides, and can make favorable the reliability of the electrical connection of the via plug to be formed.

Whereas, the via plug to be formed has the taper portion. For this reason, the effect of stress concentration onto a prescribed portion is reduced. This suppresses the occurrence of breakage or defective connection, which performs the effect of making the reliability favorable. For example, the taper portion is preferably formed on the side from which the via plug is exposed from the silicon substrate, and to which stress tends to concentrate.

Then, a method for manufacturing the package, and a specific examples of the package to be manufactured will be described by reference to the accompanying drawings.

EXAMPLE 1

Figure 1A:
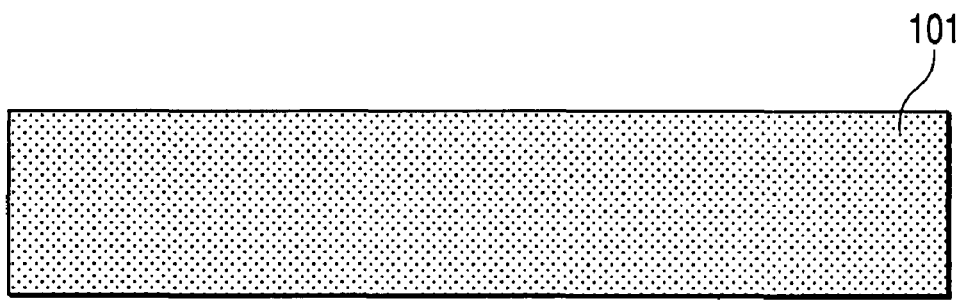
FIG. 1A shows the first view showing a manufacturing method of a package (semiconductor apparatus) in accordance with Example 1.
Figure 1B:
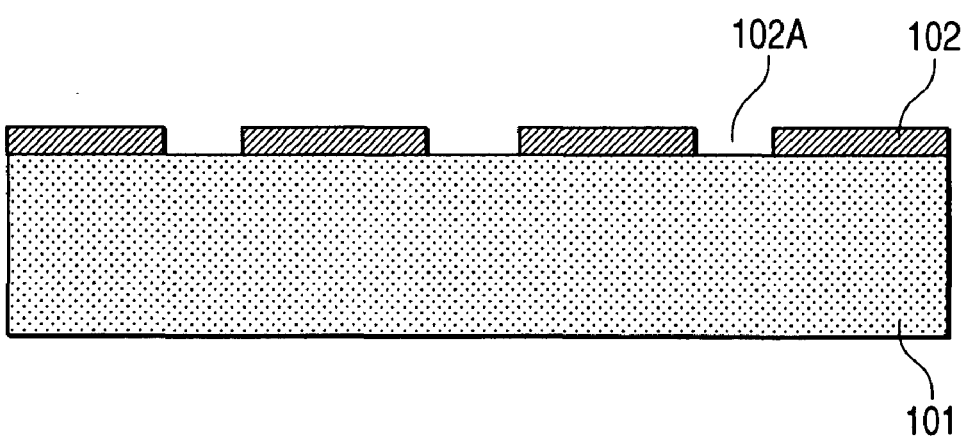
FIG. 1B shows the second view showing a manufacturing method of the package (semiconductor apparatus) in accordance with Example 1.
Figure 1C:
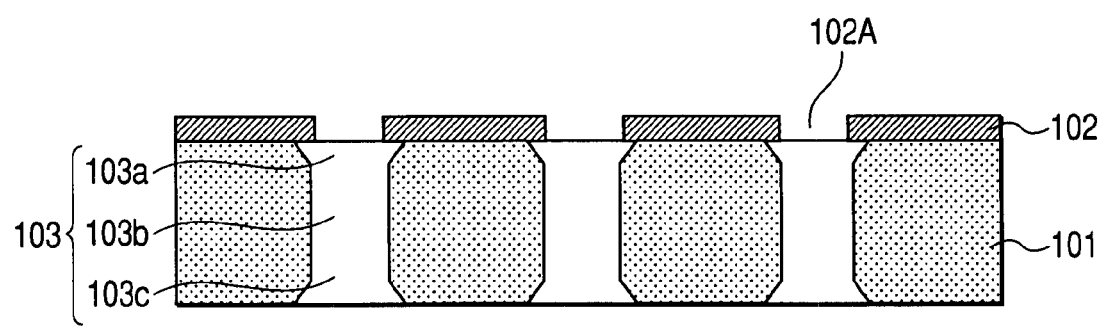
FIG. 1C shows the third view showing a manufacturing method of the package (semiconductor apparatus) in accordance with Example 1.
Figure 1D:
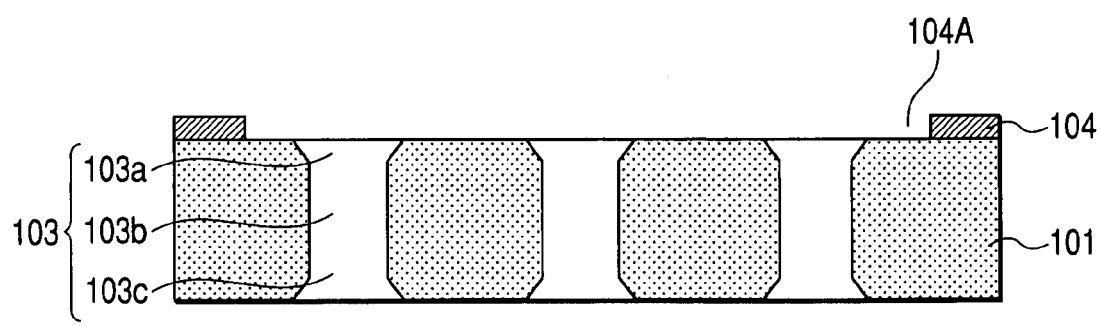
FIG. 1D shows the fourth view showing a manufacturing method of the package (semiconductor apparatus) in accordance with Example 1.
Figure 1E:
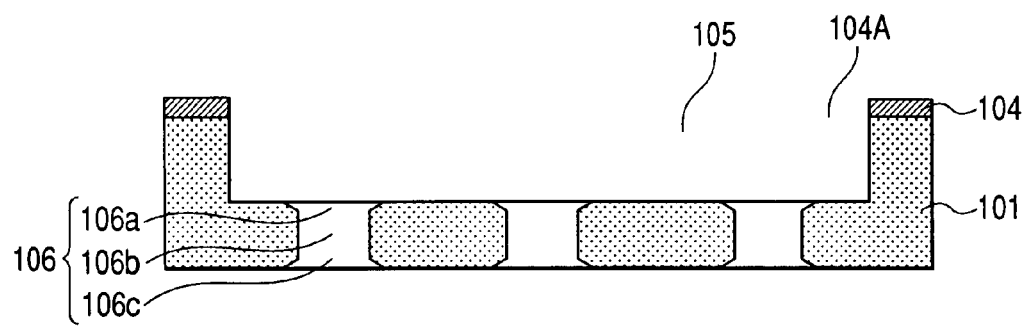
FIG. 1E shows the fifth view showing a manufacturing method of the package (semiconductor apparatus) in accordance with Example 1.
Figure 1F:
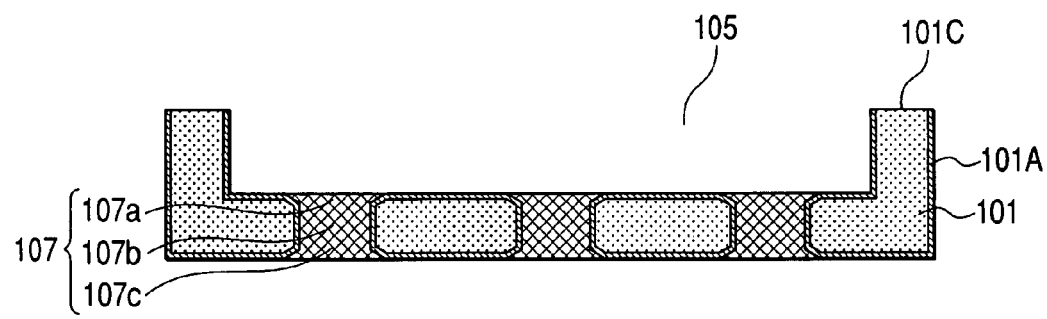
FIG. 1F shows the sixth view showing a manufacturing method of the package (semiconductor apparatus) in accordance with Example 1.

FIGS. 1A to 1G are views showing a method for manufacturing a package and a semiconductor apparatus step by step in accordance with Example 1 of the invention. Further, FIG. 1F shows the package to be manufactured, and further, FIG. 1G also shows the structure of the semiconductor apparatus to be manufactured using the package. However, in the following drawings, the devices described previously are given the same reference numerals and signs, and the description may be omitted.

First, in a step shown in FIG. 1A, a substrate made of silicon (e.g., a silicon wafer) 101 is prepared. For example, when the substrate 101 is formed of a silicon wafer, the thickness of the substrate 101 is in a range about from 600 to 800 µm. Alternatively, the substrate maybe ground such that the substrate 101 has a prescribed thickness.

Then, in a step shown in FIG. 1B, on the substrate 101, a mask pattern 102 having an opening 102A is formed. For forming the mask pattern 102, a resist layer is firstly formed either by bonding a film or coating the resist. Then, the resist layer is treated by light exposure and developed, and the mask pattern can be formed. The opening 102A is formed at the respective position where a via hole (via plug) is formed as explained in a later step.

Then, in a step shown in FIG. 1C, a via hole (through hole) 103 penetrating through the substrate 101 is formed by dry etching such as RIE (reactive ion etching) using the mask pattern 102 as a mask.

When the via hole 103 is formed, it is possible to control a dry etching as isotropic etching or anisotropic etching, which is to be adopted. This can be performed by changing the condition for the etching, such as electric power for plasma generation, pressure of the processing space, flow rate of each gas, or the combination of gases, which is so called as a recipe of dry etching.

For example, the following procedure may be adopted. That is, isotropic etching is firstly performed immediately after the etching starts. In this etching, the via hole is formed in a taper shape to form taper portion 103a. Next, anisotropic etching is performed, by which the via hole is formed in a straight shape to form a straight portion 103b. Finally, isotropic etching is performed again so as to form a taper portion 103c.

More specifically, the following procedure may be performed. First, the taper portion 103a is formed in the first step A by using isotropic etching. Then, the straight or cylindrical portion 103b is formed in the step B subsequent to the step A by using anisotropic etching. Further, the taper portion 103c is formed in the step C subsequent to the step B by isotropic etching again. As for the foregoing term "isotropic etching", it means an etching condition where isotropical etching is predominantly carried out, which does not necessarily mean ruling out of any anisotropic etching. On the contrary, the foregoing term "anisotropic etching" means an etching situation where anisotropical etching is predominantly carried out, which does not necessarily mean ruling out of any isotropic etching.

With the steps A to C, the opening sides, being opposed each other in the via hole 103, are formed in a taper shape (taper portions 103a and 103c). The portion interposed between the two taper portions 103a and 103c is formed in a straight shape (straight portion 103b).

Then, in a step shown in FIG. 1D, the mask pattern 102 is peeled off, and then, another mask pattern 104 having an opening 104A is newly formed on the substrate 101. The mask pattern 104 may be formed in the same manner as with the mask pattern 102. Namely, a resist layer is formed by bonding of a resist film or coating resist, and the resist layer is exposed to light/developed for the formation. The opening 104A is formed at a portion corresponding to the concave portion in which a semiconductor device to be mounted is housed as will be explained at a later step.

Then, in a step shown in FIG. 1E, performing etching (dry etching or wet etching) with using the mask pattern 104 as a mask, a concave portion 105 is formed at a portion corresponding to the opening 104A of the substrate 101. In this case, the length of the via hole 103 formed in the step of FIG. 1C becomes short, resulting in a via hole 106. Whereas, also in the via hole 106, the shape of the opening sides remain in a taper shape such as via hole 103. Namely, the opening sides on the opposite sides of the via hole 106 remains in a taper shape (taper portions 106a and 106c), and the portion interposed between said two taper portions remains in a straight shape (straight portion 106b).

Then, in a step of FIG. 1F, the mask pattern 104 is peeled off. Then, an insulation film 101A is formed on the surface of the substrate 101. The insulation film 101A is formed of, for example, a silicon oxide film formed by thermally oxidizing silicon. Further, the insulation film 101A is also formed on the inner wall surface of the via hole 106, so that insulation is ensured between the conductive via plug, being formed later on, and the substrate 101. Further, it is preferable to peel off a certain part of the insulation film 101A that is formed on the bonding surface 101C around the concave portion 105, to which a lid portion is bonded in a later step.

Then, for example, by using a plating method, an electrically conductive material such as Cu is embedded to form a via plug 107 in the via hole 106. In this case, first, a seed layer (power supply layer) is formed by electroless plating so that a mask pattern is formed. Then, the via plug 107 is formed with electrolytic plating using the seed layer as a power supply layer. Further, after the completion of electrolytic plating, the mask pattern and the seed layer are peeled off. Further, in the plating, the opening sides of the via hole 106 are formed in a taper shape. Therefore, a plating solution tends to spread therethrough, which suppresses the occurrence of voids or defective plating. As a result, it is possible to form a via plug with good reliability.

The via plug 107 is formed in the shape corresponding to that of the via hole 106, and has a structure having a straight portion 107b and taper portions 107a and 107c. Namely, the taper portions 107a and 107c are formed in a taper shape on the opposite sides of the via plug 107 exposed from the via hole 106. At the portion interposed between the two taper portions 107a and 107c, the straight portion 107b is formed.

Thus, the package in accordance with this example can be formed. Further, as described below, a semiconductor apparatus can be manufactured by mounting a semiconductor device on the package.

Figure 1G:
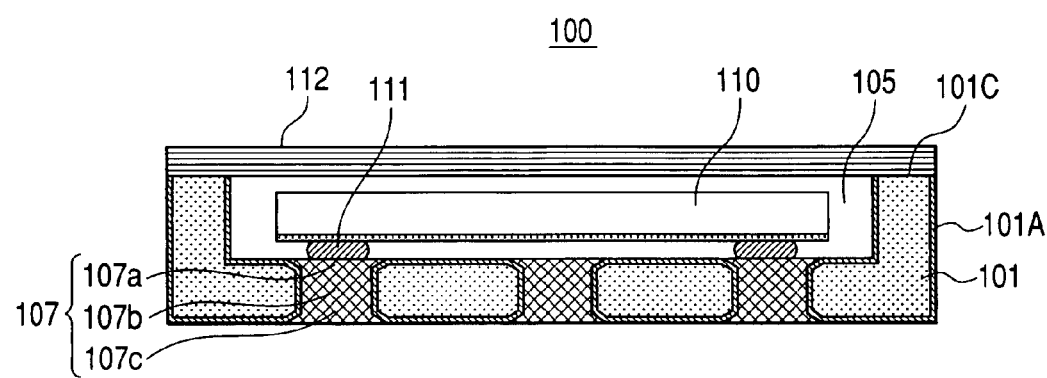
FIG. 1G shows the seventh view showing a manufacturing method of the package (semiconductor apparatus) in accordance with Example 1.

For example, in a step shown in FIG. 1G, a semiconductor device 110 is mounted so as to be housed in the concave portion 105. In this case, the semiconductor device 110 and the via plug 107 are electrically connected by a bump 111 for mounting the semiconductor device 110.

Further, a flat-panel lid portion 112, which is made of glass, for example, is bonded onto the bonding surface 101C of the substrate 101 to enclose the semiconductor device 110 in the concave portion 105. By enclosing the semiconductor device 110 in the prescribed sealed space (concave portion 105) in this manner, it becomes possible to suppress the deterioration of the semiconductor device 110, and to drive the semiconductor device 110 with stability and for a long period. Particularly, if the semiconductor device 110 is LED or other optical device consuming energy, protection of the device and stable driving are simultaneously accomplished by enclosing the device. Further, the bonding between the lid portion 112 and the substrate 101 is accomplished by, for example, anodic bonding. When the bonding is accomplished by anodic bonding, the bonding becomes easy, and the inclusion of impurities into the concave portion 105 is suppressed. Thus, this is preferable.

Thus, it is possible to manufacture a semiconductor apparatus 100 including the semiconductor device 110 mounted (enclosed) in the concave portion of the substrate 101.

With the foregoing method, it becomes possible to control variations in etching shape when the via hole 106 is formed from the via hole 103 in the silicon substrate 101, and to make favorable the reliability of the via plug 107 to be formed.

For example, turning back to the etching step shown in FIG. 1C, etching is carried out such that the opening sides of the via holes 103a and 103c are formed in a taper shape. This can suppress the occurrence of variations in etching shape on the opening sides, and make favorable there liability of the electrical connection of the via plug to be formed.

With using a conventional etching method, fine peeling or defective shape at the interface between the vicinity of the opening of the mask pattern and the substrate may cause the occurrence of etching shape defect or variation. With the manufacturing method in accordance with this example, the occurrence of such defective etching shape in the vicinity of the opening of the mask pattern is suppressed. As a result, the reliability of the via plug to be formed becomes favorable.

Further, the via plug 107 has the straight portion 107b formed in a straight shape, and the taper portions 107a and 107c formed in a taper shape. For this reason, for the via plug 107, as compared with a conventional via plug having no taper shape, the effect of stress concentration onto a prescribed portion, such as to the vicinity of the openings of the via hole, can be reduced. As a result, occurrence of breakage or defective connection can be suppressed, resulting in favorable reliability. Further, the taper portions 107a and 107c are preferably formed on the side of the via plug 107 that is exposed from the silicon substrate 101, to which stress tends to concentrate.

Further, in the example 1, the description is given by performing the isotropic dry etching and the anisotropic dry etching sequentially for the formation of the via hole. However, the invention is not necessarily limited thereto. For example, as shown below, the formation may be also carried out by combining a method of dry etching and a method of wet etching.

EXAMPLE 2

Figure 2A:
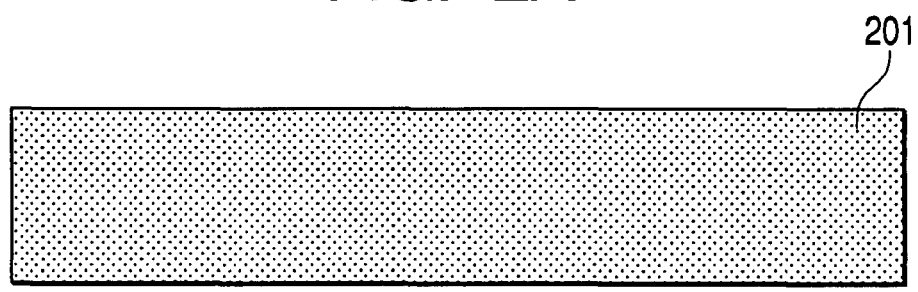
FIG. 2A shows the first view showing a manufacturing method of a package (semiconductor apparatus) in accordance with Example 2.
Figure 2B:
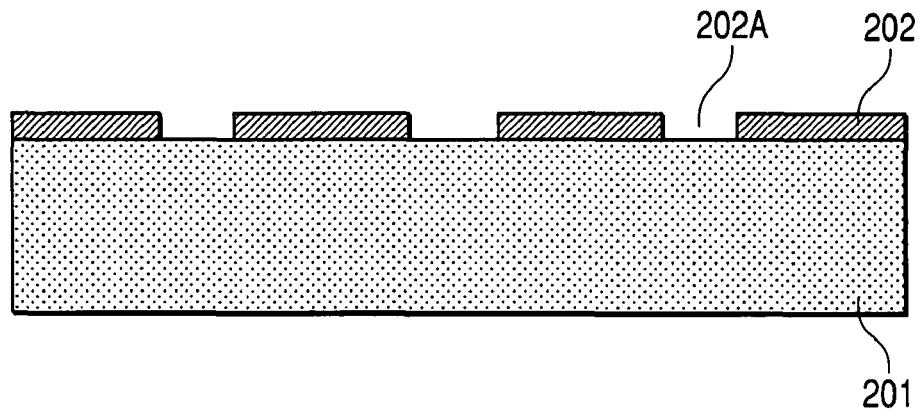
FIG. 2B shows the second view showing a manufacturing method of the package (semiconductor apparatus) in accordance with Example 2.
Figure 2C:
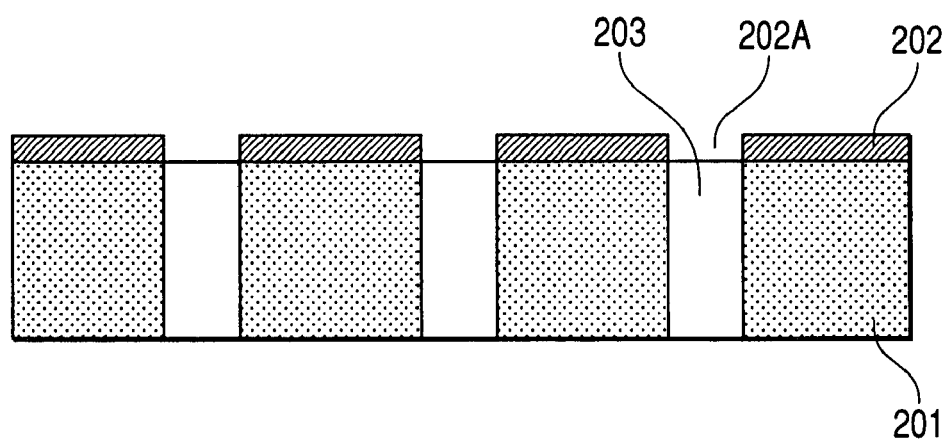
FIG. 2C shows the third view showing a manufacturing method of the package (semiconductor apparatus) in accordance with Example 2.
Figure 2D:
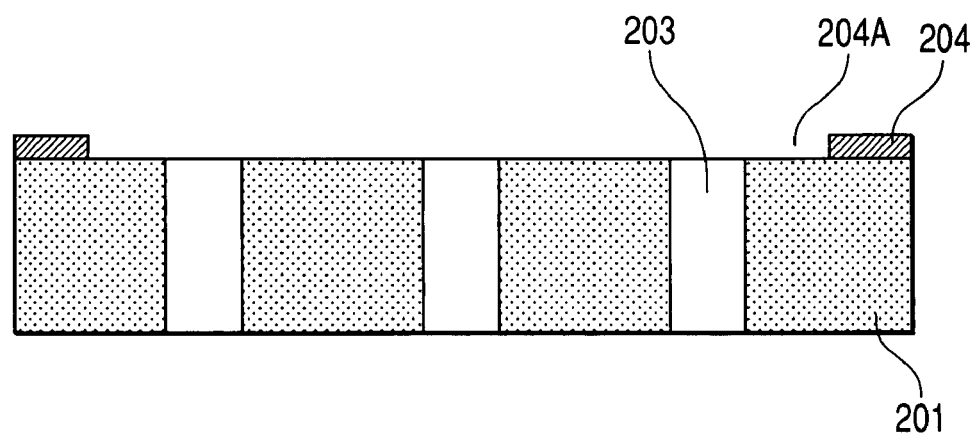
FIG. 2D shows the fourth view showing a manufacturing method of the package (semiconductor apparatus) in accordance with Example 2.
Figure 2E:
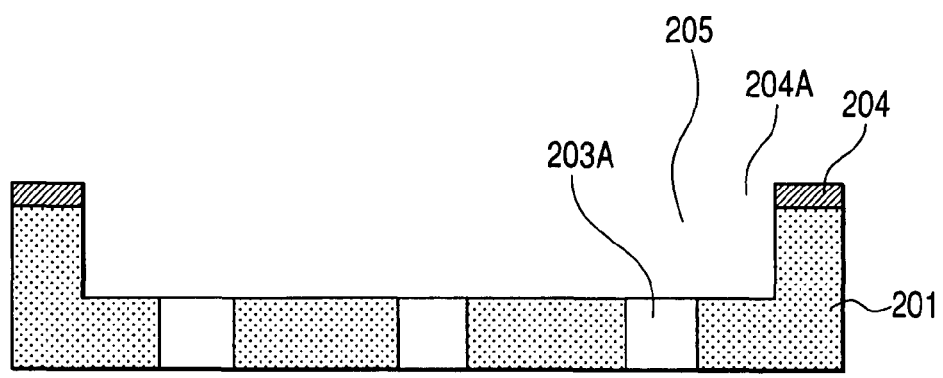
FIG. 2E shows the fifth view showing a manufacturing method of the package (semiconductor apparatus) in accordance with Example 2.
Figure 2F:
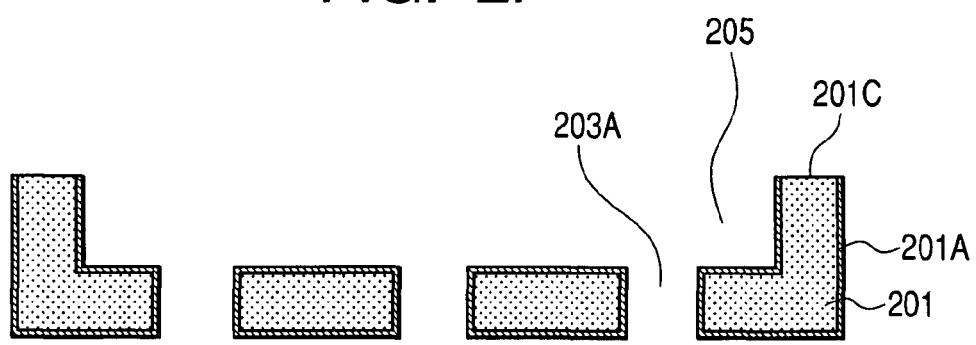
FIG. 2F shows the sixth view showing a manufacturing method of the package (semiconductor apparatus) in accordance with Example 2.
Figure 2G:
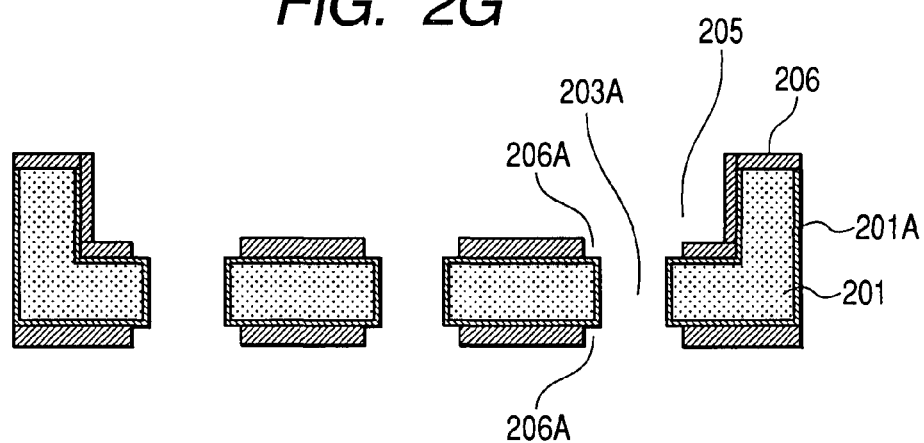
FIG. 2G shows the seventh view showing a manufacturing method of the package (semiconductor apparatus) in accordance with Example 2.
Figure 2H:
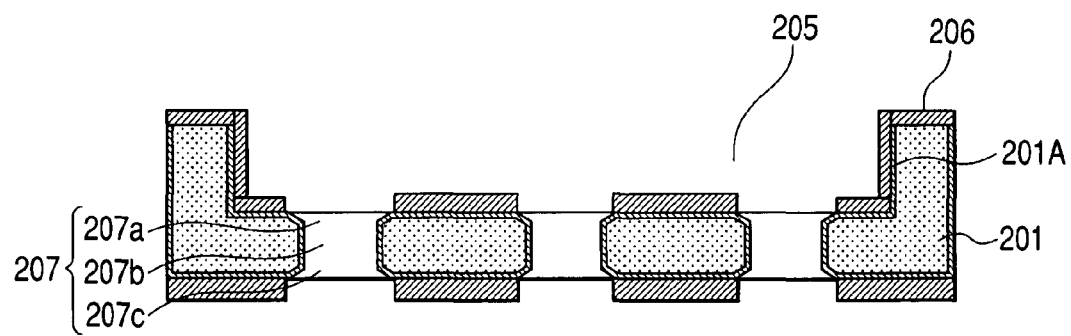
FIG. 2H shows the eighth view showing a manufacturing method of the package (semiconductor apparatus) in accordance with Example 2.
Figure 2I:
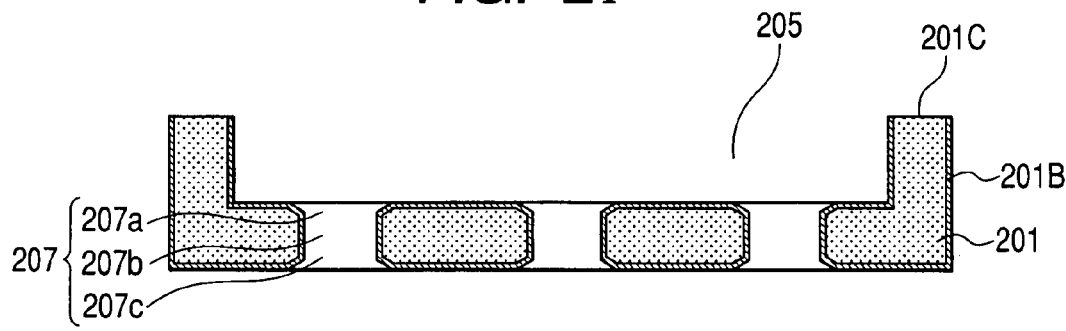
FIG. 2I shows the ninth view showing a manufacturing method of the package (semiconductor apparatus) in accordance with Example 2.
Figure 2J:
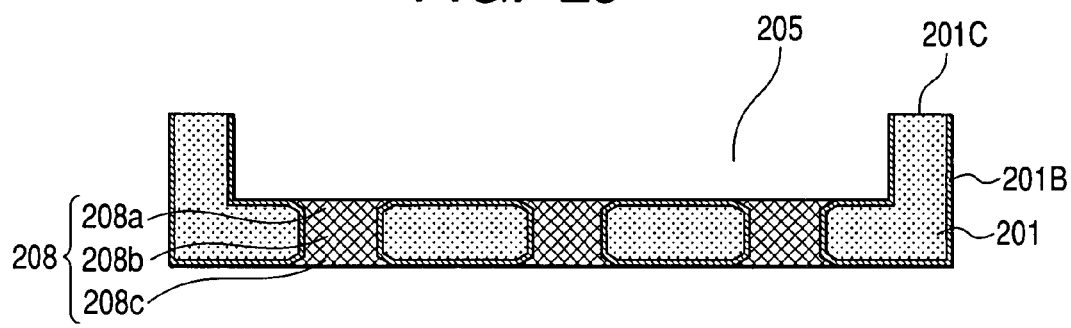
FIG. 2J shows the tenth view showing a manufacturing method of the package (semiconductor apparatus) in accordance with Example 2.

FIGS. 2A to 2K are views showing a method for manufacturing a package and a semiconductor apparatus step by step in accordance with Example 2 of the invention. Further, FIG. 2J shows the package to be manufactured, and further, FIG. 2K also shows the structure of the semiconductor apparatus to be manufactured using the package. However, in the following drawings, the devices described previously are given the same reference numerals and signs, and the description may be omitted.

First, a step shown in FIG. 2A corresponds to the step shown in FIG. 1A. A substrate 201 made of silicon corresponding to the silicon wafer 101 is prepared.

Then, in a step shown in FIG. 2B, in the same manner as the step shown in FIG. 1B, on the substrate 201, a mask pattern 202 having an opening 202A is formed. The opening 202A is formed at the position corresponding to a via hole (via plug) to be formed in a later step.

Then, in a step shown in FIG. 2C, a via hole (through hole) 203 penetrating through the substrate 201 is formed by dry etching such as RIE using the mask pattern 202 as a mask. When the via hole 203 is formed, it is controlled by, for example, the recipe of dry etching such that dry etching is anisotropic etching. As a result, the via hole 203 is formed in a straight shape. In this example, the portion to be in a taper shape of the via hole is separately formed by wet etching in a later step.

Then, in a step shown in FIG. 2D, the mask pattern 202 is peeled off. Then, in the same manner as with the step shown in FIG. 1D, a mask pattern 204 having an opening 204A is formed on the substrate 201. The opening 204A is formed correspondingly to the concave portion in which a semiconductor device to be mounted in the later step is housed.

Then, in a step shown in FIG. 2E, with etching (dry etching or wet etching) using the mask pattern 204 as a mask, a concave portion 205 is formed at a portion corresponding to the opening 204A of the substrate 201. In this case, the length of the via hole 203 formed in the step of FIG. 2C becomes short, resulting in a via hole 203A.

Then, in a step shown in FIG. 2F, the mask pattern 204 is peeled off. Then, an insulation film 201A is formed on the surface of the substrate 201. The insulation film 201A is formed of, for example, a silicon oxide film formed by thermally oxidizing silicon. Further, the insulation film 201A is also formed on the inner wall surface of the via hole 203A, so that insulation is ensured between an electrically conductive via plug to be formed later and the substrate 201. Further, it is preferable to peel off the portion of the insulation film 201A on the bonding surface 201C around the concave portion 205 to which a lid portion is bonded in a later step.

Then, in a step shown in FIG. 2G, a mask pattern 206 covering the surface of the substrate 201 (insulation film 201A) is formed. In this case, the mask pattern 206 is patterned so as to have an opening 206A from which the portion of the insulation film 201A in the periphery of the opening of the via hole 203A is exposed, and formed. Further, the openings 206A are preferably formed on both of the side on which the concave portion 205 of the substrate 201 is formed and the opposite side.

Then, in a step shown in FIG. 2H, the insulation film 201A exposed from the opening 206A is removed by dry etching or the like. Then, the exposed substrate 201 (silicon) is subjected to wet etching. By the wet etching, the opening sides of the via hole are etched to be in a taper shape. As a result, a via hole 207 shown in this drawing is formed.

The opening sides on the opposite sides of the via hole 207 are formed in a taper shape (taper portions 207a and 207c), and the portion interposed between said two taper portions is formed in a straight shape (straight portion 207b).

Then, in a step shown in FIG. 2I, the mask pattern 206 is peeled off, and then, an insulation film 201B is formed on the surface of the substrate 201 again. This is a treatment for forming another insulation film at the portion from which the insulation film 201A has been removed in the former step. Further, as described previously, it is preferable to peel off the portion of the insulation film 201B on the bonding surface 201C around the concave portion 205 to which a lid portion is bonded in a later step. Incidentally, the formation of an insulation film onto the substrate 201 may also be carried out only by the step shown in this drawing without performing the step of FIG. 2F. In this case, the step of locally peeling the insulation film (FIG. 2G) becomes unnecessary.

Then, in a step shown in FIG. 2J, for example, with a plating method, in the via hole 207, an electrically conductive material such as Cu is embedded to form a via plug 208. In this case, first, a seed layer (power supply layer) is formed with electroless plating, and then, a mask pattern is formed. Then, the via plug 208 is formed with electrolytic plating using the seed layer as a power supply layer. Further, after the completion of electrolytic plating, the mask pattern and the seed layer are peeled off. Further, in the plating, the opening sides of the via hole 207a and 207c are formed in a taper shape. Therefore, a plating solution tends to spread therethrough, which suppresses the occurrence of voids or defective plating. As a result, it is possible to form a via plug with good reliability.

The via plug 208 is formed in the shape corresponding to that of the via hole 203C, and has a structure having a straight portion 208b in a straight shape and taper portions 208a and 208c in a taper shape. Namely, on the opposite sides of the via plug 208 exposed from the via hole 207, the taper portions 208a and 208c in a taper shape are formed. At the portion interposed between said two taper portions, the straight portion 207b in a straight shape is formed.

Thus, the package in accordance with this example can be formed. Alternatively, as described below, a semiconductor apparatus can also be manufactured by mounting a semiconductor device on the package.

Figure 2K:
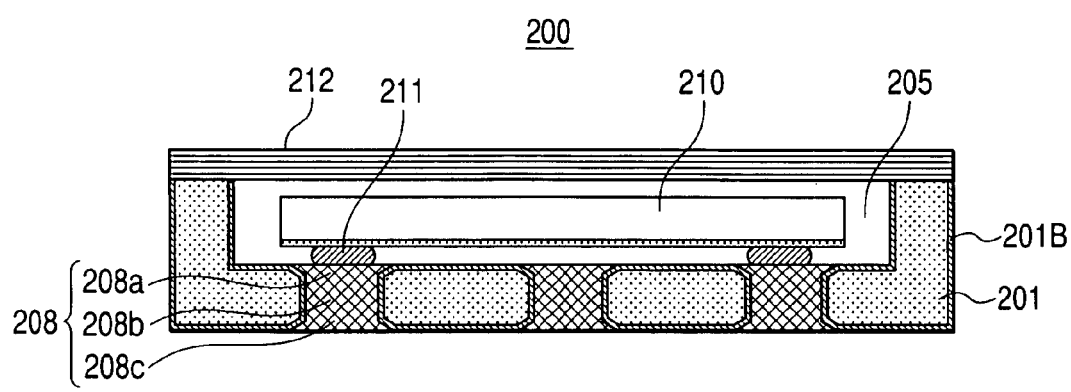
FIG. 2K shows the eleventh view showing a manufacturing method of the package (semiconductor apparatus) in accordance with Example 2.

For example, in a step shown in FIG. 2K, a semiconductor device 210 is mounted so as to be housed in the concave portion 205. In this case, the semiconductor device 210 and the via plug 208 are electrically connected by a bump 211 for mounting the semiconductor device 210.

Further, a flat-panel lid portion 212 formed of, for example, glass, is bonded onto the bonding surface 201C of the substrate 201 to enclose the semiconductor device 210 in the concave portion 205. By enclosing the semiconductor device 210 in the prescribed sealed space (concave portion 205) in this manner, it becomes possible to suppress the deterioration of the semiconductor device 210, and to drive the semiconductor device 210 with stability and for a long period. Particularly, when the semiconductor device 210 is LED or other optical device consuming relatively high energy, protection of the device and stable driving are simultaneously accomplished by enclosure of the device. Further, the bonding between the lid portion 212 and the substrate 201 is accomplished by, for example, anodic bonding. When the bonding is accomplished by anodic bonding, the bonding becomes easy, and the inclusion of impurities into the concave portion 205 is suppressed. Thus, this is preferable.

Thus, it is possible to manufacture a semiconductor apparatus 200 including the semiconductor device 210 mounted (enclosed) in the concave portion of the substrate 201.

The foregoing manufacturing method performs the same effects as in the case of Example 1. Namely, it becomes possible to control variations in etching shape when the via hole 207 is formed from the via hole 203 in the silicon substrate 201, and to make favorable the reliability of the via plug 208 to be formed.

Whereas, for the via plug 107, as with the case of Example 1, the effect of stress concentration onto a prescribed portion (vicinity of the opening of the via hole) is reduced. This suppresses the occurrence of breakage or defective connection, resulting in favorable reliability.

Incidentally, in Examples 1 and 2 described above, the description was given by showing one package. However, in actual package manufacturing, a plurality of packages are formed on one substrate (wafer), and in the subsequent steps, the substrate is cut into individual pieces to manufacture packages.

For example, on one substrate, a plurality of concave portions or via plugs are formed. Then, the substrate is cut to form individual packages. Thereafter, semiconductor devices are mounted on individual packages resulting from cutting into individual pieces, thereby manufacturing semiconductor apparatuses.

Up to this point, the preferred embodiments of the invention were described in details. However, the invention is not limited to such specific embodiments, and various modifications/changes are possible within the scope of the gist of the invention described in the appended claims.

For example, the method for filling up the via hole 106 (207) is not limited to the plating method. A CVD method, a sputtering method, or the like may be used. Further, the electrically conductive material forming the via plug 107 (208) is not limited to Cu. Al, W, or an alloy material may be used.

Further, the semiconductor devices to be mounted are not limited to the LED or other optical device. Other various devices, such as a device so called MEMS (micro electro mechanical system) can be also mounted.

In accordance with the present invention, it becomes possible to make favorable the reliability of mounting of a semiconductor apparatus including a semiconductor device mounted on a silicon substrate.

The present invention having been described with reference to the foregoing embodiments should not be limited to the disclosed embodiments and modifications, but may be implemented in many ways without departing from the spirit of the invention.

What is claimed is:

1. A method for manufacturing a semiconductor device package comprising:
   the following steps in order:
   (1) a step of forming a mask pattern;
   (2) a step of forming a first opening of a via hole in a taper shape on a silicon substrate by isotropic dry etching;
   (3) a step of forming the via hole to penetrate through the silicon substrate in a straight shape to form a second opening by anisotropic dry etching;
   (4) a step of forming the second opening of the via hole in a taper shape by isotropic dry etching; and
   (5) a step of embedding conductive material in the via hole to form a via plug.

2. The method for manufacturing a semiconductor device package according to claim 1, wherein said etching is carried out in a way such that each opening of the via hole is formed in a taper shape.

3. The method for manufacturing a semiconductor device package according to any one of claims 1 or 2, wherein said method for manufacturing a semiconductor package further includes a step of forming a concave portion-in the silicon substrate.

4. The method for manufacturing a semiconductor device package according to claim 1, wherein the mask pattern formed in step 1 is used in step 2 to step 4.

5. The method for manufacturing a semiconductor device package according to claim 1, wherein step 2 comprises:
   (2) a step of forming a first opening of a via hole in a taper shape on a silicon substrate by isotropic dry etching or anisotropic dry etching depending on a dry etching condition; wherein step 3 comprises:
   (3) a step of forming the via hole to penetrate through the silicon substrate in a straight shape to form a second opening by isotropic dry etching or anisotropic dry etching depending on the dry etching condition; and wherein step 4 comprises:
   (4) a step of forming the second opening of the via hole in a taper shape by isotropic dry etching or anisotropic dry etching depending on the dry etching condition.

6. The method for manufacturing a semiconductor device package according to claim 1, wherein the first opening and the second opening are tapered to be wider at the first opening and the second opening than at a center portion of the via hole.

7. A method for manufacturing a semiconductor apparatus comprising:
   the following steps in order:
   (1) a step of forming a mask pattern;
   (2) a step of forming a first opening of a via hole in a taper shape on a silicon substrate by isotropic dry etching;
   (3) a step of forming the via hole to penetrate through the silicon substrate in a straight shape by anisotropic dry etching, the via hole now having the first opening and a second opening;
   (4) a step of forming the second opening of the via hole in a taper shape by isotropic dry etching;
   (5) a step of forming a concave portion in the silicon substrate;
   (6) a step of embedding conductive material in the via hole to form a via plug, and
   (7) a step of mounting a semiconductor device on the concave portion.

8. A method for manufacturing a semiconductor device package comprising:
   the following steps in order:
   (1) a step of dry etching a silicon substrate to form a straight via hole which penetrates through the silicon substrate;
   (2) a step of forming a concave portion-in the silicon substrate that includes the straight via hole;
   (3) a wet etching step of forming the straight via hole into a taper shape via hole; and
   (4) a step of embedding conductive material in the taper shape via hole to form a via plug.

* * * * *